United States Patent
Takase et al.

(10) Patent No.: US 7,507,682 B2
(45) Date of Patent: Mar. 24, 2009

(54) METHOD OF MANUFACTURING CERAMIC PASTE AND CERAMIC MULTI-LAYER WIRING SUBSTRATE UTILIZING THE SAME

(75) Inventors: Hiroyuki Takase, Osaka (JP); Shinichi Suzuki, Osaka (JP); Yutaka Iki, Osaka (JP)

(73) Assignee: Kyocera Corporation, Kyoto (JP)

( * ) Notice: Subject to any disclaimer, the term of this patent is extended or adjusted under 35 U.S.C. 154(b) by 204 days.

(21) Appl. No.: 11/064,784

(22) Filed: Feb. 23, 2005

(65) Prior Publication Data

US 2005/0186407 A1   Aug. 25, 2005

(51) Int. Cl.
*C03C 8/16* (2006.01)
*H01B 1/02* (2006.01)

(52) U.S. Cl. .............. 501/20; 501/18; 501/21; 501/32; 252/519.12; 252/519.33; 252/519.51; 252/519.54; 252/520.2; 252/520.21; 252/520.22

(58) Field of Classification Search .............. 428/210; 252/514, 521, 363.5, 519, 12, 33, 51, 519.54, 252/520.2, 520.21, 520.22; 501/18, 20, 21, 501/32
See application file for complete search history.

(56) References Cited

U.S. PATENT DOCUMENTS

| | | | |
|---|---|---|---|
| 5,637,261 A * | 6/1997 | Mattox | 252/514 |
| 6,579,394 B1 * | 6/2003 | Nakamura et al. | 156/89.12 |
| 6,589,446 B1 * | 7/2003 | Nakamura et al. | 252/363.5 |
| 6,673,386 B2 * | 1/2004 | Komyoji et al. | 427/8 |
| 6,975,502 B2 * | 12/2005 | Murosawa et al. | 361/321.2 |
| 6,987,662 B2 * | 1/2006 | Hibi et al. | 361/312 |
| 7,046,502 B2 * | 5/2006 | Murosawa et al. | 361/321.2 |
| 7,072,170 B2 * | 7/2006 | Miyauchi et al. | 361/321.2 |

FOREIGN PATENT DOCUMENTS

| | | |
|---|---|---|
| JP | 05-003273 | 1/1993 |
| JP | 11-097272 | 4/1999 |

* cited by examiner

*Primary Examiner*—Cathy Lam
(74) *Attorney, Agent, or Firm*—Hogan & Hartson LLP

(57) ABSTRACT

In manufacturing a ceramic multi-layer wiring substrate which is formed by stacking a plurality of ceramic layers and which includes an internal wiring, a ceramic paste is printed using a screen printing process on a part of a ceramic green sheet to be a ceramic layer having the internal wiring formed thereon which part does not include the internal wiring, to form between the ceramic layers a ceramic filling layer including a same ceramic component as that in the ceramic layers which ceramic filling layer is not formed on the internal wiring. The ceramic paste includes a ceramic component, an acrylic resin, and a cellulose resin, and loss factor tan $\delta$ of the paste represented by (loss modulus)/(storage modulus) in a dry condition after printing is equal to or greater than loss factor tan $\delta$ of a conductor paste layer to be the internal wiring in a dry condition.

5 Claims, 1 Drawing Sheet

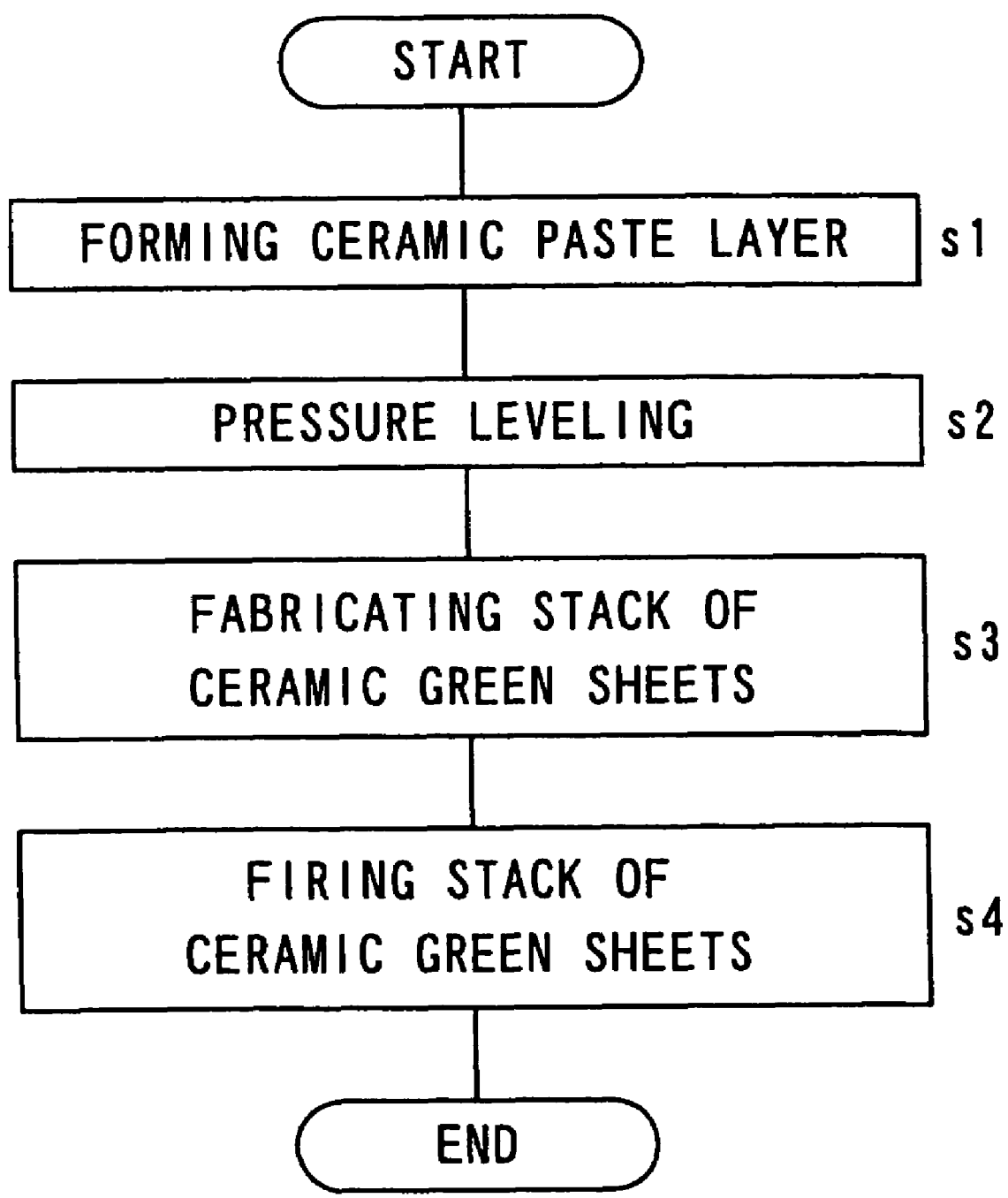

METHOD OF MANUFACTURING CERAMIC PASTE AND CERAMIC MULTI-LAYER WIRING SUBSTRATE UTILIZING THE SAME

BACKGROUND OF THE INVENTION

1. Field of the Invention

The present invention relates to a method of manufacturing a ceramic paste and a ceramic multi-layer wiring substrate having an internal wiring utilizing the same. More particularly, the invention relates to a method of manufacturing a ceramic multi-layer wiring substrate formed by a plurality of ceramic layers stacked one on top of another and having an internal wiring, in which a ceramic filling layer including the same ceramic component as that in the ceramic layers is formed in a region having no internal wiring formed therein between the ceramic layers stacked so that the internal wiring is sandwiched therebetween. More specifically, the invention relates to a method of manufacturing a ceramic paste which is preferable for fabricating a ceramic green sheet having substantially no irregularity and thereby preventing a layer bonding failure and warping deformation of a ceramic multi-layer wiring substrate more effectively, and a ceramic multi-layer wiring substrate using the ceramic paste.

2. Description of the Related Art

A ceramic multi-layer wiring substrate according to the related art has a structure in which a metalized wiring layer is disposed on a surface or inside of an insulated substrate formed by stacking a plurality of insulation layers. A typical example of ceramic multi-layer wiring substrates having such a structure is semiconductor device containing packages which contain semiconductor devices such as LSIs. Semiconductor device containing packages of this type having insulation layers made of ceramics such as alumina are frequently used. Further, products which have recently been put into practical use include products utilizing an insulated substrate formed by stacking insulation layers constituted by a glass-ceramic sintered body that can be fired simultaneously with a copper-metalized material.

Such a ceramic multi-layer wiring substrate is manufactured by adding an appropriate organic binder to powder of ceramic materials mixed in a predetermined ratio, dispersing the resultant powder in an organic solvent to prepare slurry, and molding the slurry into a ceramic green sheet (hereinafter referred to as a green sheet) having a predetermined thickness using a casting process well-known in the related art such as a doctor blade process or lip coater process.

Next, a metalized wiring layer is provided by printing metal paste, which is obtained by adding and mixing an organic binder, a solvent, and a plasticizer in appropriate metal powder, in a predetermined pattern on the green sheet using the well-known screen printing process. Simultaneously through holes are formed in the resultant layer using a micro-drill or laser, and the through holes are filled with the metal paste to form through conductors (via conductors or via holes).

Thereafter, a plurality of such green sheets are stacked using an appropriate bonding liquid, and the resultant stack of green sheets is fired under predetermined conditions to obtain a ceramic multi-layer wiring substrate.

Related art is disclosed in Japanese Unexamined Patent Publications JP-A 5-3273 (1993) and JP-A 11-97272 (1999).

The ceramic multi-layer wiring substrates (hereinafter also simply referred to as substrates) according to the related art as described above, tend to be made smaller and thinner associated with the increase and advance of functions of such substrates. Further, wiring patterns and via holes formed on a substrate are becoming finer, which has resulted in demands for improvement in accuracy of stacking. Particularly, under the circumstance in which ceramic multi-layer wiring substrates are becoming thinner, gaps in such a substrate generated during formation of an internal wiring due to a height difference attributable to the thickness of the internal wiring are difficult to eliminate completely during layer stacking by utilizing only plastic deformation of a green sheet whose thickness is small. As a result, there arises a problem that a layer bonding failure or so-called delamination and warping deformation can occur in such a product after it is fired.

As means for solving this problem, a screen printing process is performed to form a ceramic filling layer including a same ceramic component as that in ceramic layers in a region between the ceramic layers which are stacked so that an internal wiring is sandwiched therebetween, the region having no internal wiring formed therein.

However, a green sheet having a ceramic filling layer obtained by the screen printing process has a problem in that the layer pattern can bulge at edges thereof due to surface tension when the screen is separated from the same, and a phenomenon also occurs in which the pattern bulges in a substantially semicircular or semi-elliptic shape when the pattern is constituted by very fine lines having a great thickness. It is therefore difficult to eliminate irregularities on the surface of the sheet completely, and it is required to add a step for pressing the sheet with a surface-leveling press to level the same.

A cellulose type binder which generally has high printability is often used as a binder for a ceramic paste used in a screen printing process. However, since a ceramic paste utilizing a cellulose type binder has low fluidity, it is difficult to level the paste sufficiently at the pressure leveling step. Under the circumstance, it is a general practice to add an acryl type binder to a cellulose type binder in ceramic paste for the purpose of providing it with plasticity and to improve fluidity of the binder by adding it with a plasticizer such as phthalic ester and a solvent having a high boiling point in a somewhat large amount.

However, when the balance of viscoelastic properties of ceramic pastes is not properly controlled, it is difficult to level a ceramic paste without deforming an internal wiring pattern adjacent to the ceramic paste if the pressure leveling is performed under a temperature condition that is equal to or higher than the glass-transition temperature of an acryl type binder added to the ceramic paste. Specifically, when loss factor $\tan \delta =$ (loss modulus)/(storage modulus) of the ceramic paste in a dry condition at a temperature near the heating temperature of the pressure leveling step is smaller than loss factor $\tan \delta$ of a conductor paste layer to be an internal wiring in a dry condition, a stress is applied from the ceramic paste whose behavior is dominantly elastic to the internal wiring layer whose behavior is dominantly viscous. As a result, there is a high possibility of the problem that the internal wiring is significantly deformed.

It is therefore difficult to protect the adjacent internal wiring from deformation during pressing only by increasing the elastic modulus of the ceramic paste used for the internal wiring or, in other words, by providing means for reducing the loss factor $\tan \delta$ of the ceramic paste used for the internal wiring in a dry condition to form a more rigid ceramic paste layer whose behavior is dominantly elastic.

When an acryl type binder is used without adjusting its molecular weight properly, a problem is frequently created by spinnability that is a shortcoming of the use of an acryl type binder in screen printing.

When a plasticizer and solvent are excessively used, a ceramic paste tends to have high viscosity attributable to insufficient drying even if a drying step is performed after screen printing. Therefore, a resultant printed material may remain viscous or may have low strength, which results in a problem in that the printed material can be subjected to cohesive breakage or interfacial breakage and transferred to a surface of the press during the pressure leveling step.

SUMMARY OF THE INVENTION

The invention has been completed taking the problems into consideration, and it is an object of the invention to provide a method of manufacturing a ceramic paste and a ceramic multi-layer wiring substrate utilizing the same, in which a region having no internal wiring formed therein is filled with a ceramic paste which is highly suitable for screen printing and which is properly balanced with an internal wiring in viscoelasticity; a subsequent pressure leveling step is performed under a heating condition that is equal to or higher than the glass-transition temperature of an acryl type binder in the ceramic paste to provide the ceramic paste with sufficient fluidity without increasing the amount of a plasticizer or solvent and to thereby prevent deformation of the internal wiring; and thus, a layer bonding failure and warping deformation of the ceramic multi-layer wiring substrate can be more effectively prevented.

The invention provides a ceramic paste used for manufacture of a ceramic multi-layer wiring substrate which is formed by stacking a plurality of ceramic layers one on top of another and which includes an internal wiring, the ceramic paste being printed, using a screen printing process, on a part of a ceramic green sheet to be a ceramic layer having the internal wiring formed thereon which part doe not include the internal wiring, to form between the ceramic layers a ceramic filling layer containing a same ceramic component as that in the ceramic layers which ceramic filling layer is not formed on the internal wiring, the ceramic paste comprising: a ceramic component; an acrylic resin; and a cellulose resin, wherein loss factor tan δ represented by (loss modulus)/(storage modulus) in a dry condition after printing is equal to or greater than loss factor tan δ of a conductor paste layer to be the internal wiring in a dry condition.

In the invention, it is preferable that the acrylic resin has a glass-transition temperature in a range of 20° C. to 50° C.

Further, in the invention, it is preferable that the acrylic resin has a glass-transition temperature in a range of 20° C. to 30° C.

Further, in the invention, it is preferable that the acrylic resin has a molecular weight in a range of 40000 to 60000.

Further, in the invention, it is preferable that the cellulose resin includes at least either nitrocellulose or ethyl cellulose.

Further, in the invention, it is preferable that the acrylic resin constitutes 20% to 90% by weight to the total amount or 100% by weight of the mixture of the acrylic resin and the cellulose resin.

Further, in the invention, it is preferable that the acrylic resin constitutes 50% to 90% by weight to the total amount or 100% by weight of the mixture of the acrylic resin and the cellulose resin.

The invention provides a method of manufacturing a ceramic multi-layer wiring substrate in which, in manufacturing the ceramic multi-layer wiring substrate which is formed by stacking a plurality of ceramic layers one on top of another and includes an internal wiring, a ceramic filling layer is formed between ceramic layers between which the internal wiring is sandwiched, which ceramic filling layer contains a same ceramic component as that in the ceramic layers and is not formed in a region between the ceramic layers where the internal wiring exists, the method comprising:

a step of forming a ceramic paste layer by printing a ceramic paste on a part of the ceramic green sheet to be the ceramic layer having the internal wiring formed thereon using a screen printing process, a conductor paste layer to be the internal wiring not existing in the part of the ceramic green sheet, the ceramic paste including the ceramic component, an acrylic resin, and a cellulose resin, and loss factor tan δ of the ceramic paste represented by (loss modulus)/(storage modulus) in a dry condition after printing being equal to or greater than loss factor tan δ of the conductor paste layer in a dry condition;

a step of drying the ceramic paste layer and thereafter pressing the ceramic paste layer at a temperature equal to or higher than a glass-transition temperature of the acrylic resin to level the ceramic paste layer with a surface of the ceramic green sheet through plastic deformation;

a step of stacking the ceramic green sheet having the ceramic paste layer formed thereon and another ceramic green sheet to fabricate a stack of ceramic green sheets; and a step of firing the stack of ceramic green sheets.

In the invention, it is preferable that the ceramic paste layer is pressed at a temperature in a range of 50° C. to 80° C.

According to the invention, the ceramic paste includes a ceramic component, an acrylic resin, and a cellulose resin. Therefore, in addition to the advantage of the plasticity of the acrylic resin, the use of the cellulose resin allows the ceramic paste to have higher viscosity and thixotropy without increasing the amount of the binder in the ceramic paste, which makes it possible to improve screen-printability.

The loss factor tan δ of the ceramic paste represented by (loss modulus)/(storage modulus) in a dry condition after printing is equal to or greater than the loss factor tan δ of the conductor paste layer to be the internal wiring in a dry condition. Therefore, the ceramic paste whose behavior is dominantly viscous flows when pressed, and it is therefore possible to prevent deformation of the adjacent internal wiring whose behavior is dominantly elastic. Since no unwanted elastic stress is applied from the ceramic paste layer to the internal wiring, damage such as a crack on the internal wiring can be prevented. As a result, it is possible to prevent a damaged part of the conductor paste layer from sticking to the press surface and consequently coming off at the leveling step. That is, the use of the ceramic paste according to the invention makes it possible to prevent deformation and damage of an internal wiring and to form a flat ceramic layer having no defect consequently. Therefore, in a ceramic multi-layer wiring substrate provided by stacking such layers, a layer bonding failure and warping deformation can be more effectively prevented.

Further, according to the invention, the acrylic resin in the ceramic paste preferably has a glass-transition temperature in the range of 20° C. to 50° C., more preferably 20° C. to 30° C. Therefore, the ceramic paste can be provided with fluidity without increasing the amount of a plasticizer or solvent to prevent deformation of the internal wiring by performing pressure leveling within the temperature range of 50° C. to 80° C. which is equal to or higher than the glass-transition temperature and at which the ceramic multi-layer wiring substrate is not deformed as a whole.

Further, according to the invention, since the acrylic resin in the ceramic paste has a molecular weight in the range of 40000 to 60000, the spinnability of the ceramic paste can be reduced.

Further, according the invention, the cellulose resin includes at least either nitrocellulose or ethyl cellulose to improve printability. That is, there is an advantage of mitigating problems such as insufficient viscosity and thixotropy of the paste, the problem of spinnability during printing, and insufficient film strength of a printed material, which are shortcomings originating from an acrylic resin.

Further, according to the invention, since the acrylic resin constitutes 20% to 90% by weight, more preferably 50% to 90% by weight to the total amount or 100% by weight of the mixture of the acrylic resin and the cellulose resin, it is possible to keep the loss factor tan δ of the ceramic paste higher than that of the internal wiring or, in other words, to make viscous behaviors more dominant than elastic behaviors to provide the ceramic paste with sufficient fluidity without deforming the internal wiring at the pressure leveling step performed while applying heat. This makes it possible to prevent the ceramic paste from tending to exhibit somewhat insufficient thixotropy during screen printing.

According to the invention, provided is a method of manufacturing a ceramic multi-layer wiring substrate in which, in manufacturing the ceramic multi-layer wiring substrate which is formed by stacking a plurality of ceramic layers one on top of another and includes an internal wiring, a ceramic filling layer is formed between ceramic layers between which the internal wiring is sandwiched, which ceramic filling layer contains a same ceramic component as that in the ceramic layers and is not formed in a region between the ceramic layers where the internal wiring exists. The method comprises a step of forming a ceramic paste layer by printing a ceramic paste on a part of the ceramic green sheet to be the ceramic layer having the internal wiring formed thereon using a screen printing process, a conductor paste layer to be the internal wiring not existing in the part of the ceramic green sheet, the ceramic paste including the ceramic component, an acrylic resin, and a cellulose resin, and loss factor tan δ of the ceramic paste represented by (loss modulus)/(storage modulus) in a dry condition after printing being equal to or greater than loss factor tan δ of the conductor paste layer in a dry condition; a step of drying the ceramic paste layer and thereafter pressing the ceramic paste layer at a temperature equal to or higher than a glass-transition temperature of the acrylic resin to level the ceramic paste layer with a surface of the ceramic green sheet through plastic deformation; a step of stacking the ceramic green sheet having the ceramic paste layer formed thereon and another ceramic green sheet to fabricate a stack of ceramic green sheets; and a step of firing the stack of ceramic green sheets. Thus, the ceramic paste whose behavior is dominantly viscous flows at the pressure leveling step, and it is therefore possible to prevent deformation of the adjacent internal wiring whose behavior is dominantly elastic. Since no unwanted elastic stress is applied from the ceramic paste layer to the internal wiring, damage such as a crack on the internal wiring can be prevented. As a result, it is possible to prevent a damaged part of the conductor paste layer from sticking to the press surface and consequently coming off at the leveling step. That is, according to the method of manufacturing a ceramic multi-layer wiring substrate of the invention, it is possible to prevent deformation and damage of an internal wiring and to form a flat ceramic layer having no defect consequently. Therefore, in a ceramic multi-layer wiring substrate provided by stacking such layers, a layer bonding failure and warping deformation can be more effectively prevented.

BRIEF DESCRIPTION OF THE DRAWINGS

Other and further objects, features, and advantages of the invention will be more explicit from the following detailed description taken with reference to the drawing wherein:

FIG. 1 is a flowchart to explain a method of manufacturing a ceramic multi-layer wiring substrate of the invention.

DETAILED DESCRIPTION OF THE PREFERRED EMBODIMENT

A detailed description will now be made on a method of manufacturing a ceramic paste and a ceramic multi-layer wiring substrate utilizing the same according to the invention.

FIG. 1 is a flowchart to explain a method of manufacturing a ceramic multi-layer wiring substrate of the invention. First, a green sheet for fabricating a ceramic multi-layer wiring substrate is fabricated as described below. A ceramic powder serving as a sintering assistant, if desired, is added to and mixed with a powder of a row material for a green sheet, e.g. at least either ceramic powder or glass powder, and the resultant mixture is added with additives such as a binder and plasticizer and an organic solvent to prepare a slurry. Thereafter, the slurry is molded into a green sheet having a predetermined thickness using a molding process such as a doctor blade process, milling, and pressing.

Next, the green sheet subjected to punching to form a through hole serving as a via hole for connecting wiring conductor layers to be located above and below the sheet, and the through hole is filled with a conductor paste.

The ceramic powder may be a mixed oxide obtained by mixing $SiO_2$, $Al_2O_3$, $ZrO_2$, or $TiO_2$ with an alkaline earth metal oxide or a mixed oxide (e.g., spinel, mullite, or cordiarite) including at least one kind of compound selected from ZnO, MgO, $MgAl_2O_4$, $ZnAl_2O_4$, $MgSiO_3$, $Mg_2SiO_4$, $Zn_2SiO_4$, $Zn_2TiO_4$, $SrTiO_3$, $CaTiO_3$, $MgTiO_3$, $BaTiO_3$, $CaMgSi_2O_6$, $SrAl_2Si_2O_8$, $BaAl_2Si_2O_8$, $CaAl_2Si_2O_8$, $Mg_2Al_4Si_5O_{18}$, $Zn_2Al_4Si_5O_{18}$, AlN, $Si_3N_4$, SiC, $Al_2O_3$, and $SiO_2$, and such a mixed oxide may be selected according to the purpose of use.

For example, the glass powder is preferably a glass including at least one kind of compound selected from a group of compounds of $SiO_2$—$B_2O_3$ type, $SiO_2$—$B_2O_3$—$Al_2O_3$ type, $SiO_2$—$B_2O_3$—$Al_2O_3$-MO type (M is Ca, Sr, Mg, Ba, or Zn), $SiO_2$—$Al_2O_3$-$M_1$O-$M_{20}$ type ($M_1$ and $M_2$ are the same element or different elements among Ca, Sr, Mg, Ba, or Zn), $SiO_2$—$B_2O_3$—$Al_2O_3$-$M_1$O-$M_2$O type ($M_1$ and $M_2$ may be the same elements as above), $SiO_2$—$B_2O_3$-$M_3$O type ($M_3$ is Li, Na, or K), and $SiO_2$—$B_2O_3$—$Al_2O_3$-$M_3$O type ($M_3$ may be the same elements as above), Pb type glass, Bi type glass, alkaline metal oxide, alkaline earth metal oxide, and rare-earth metal oxide. Those glasses to be used include glasses which remain amorphous even after being subjected to a firing process and glasses which are transformed by a firing process into crystallized glasses on which crystals of at least one kind among lithium silicate, quartz, cristobalite, cordierite, mullite, anorthite, celsian, spinel, gahnite, willemite, dolomite, petalite, and substitution derivatives thereof are deposited.

The ceramic power-glass power mixing ratio is that used in normal glass ceramic substrate materials and is preferably in the range of 60:40 to 1:99 by weight.

$B_2O_3$, ZnO, $MnO_2$, an alkaline metal oxide, an alkaline earth metal oxide, or a rare-earth metal oxide may be used as the assistant component, and they may be selected according to the purpose of use.

Further, binders commonly used in green sheets may be used, including, for example, monopolymers or copolymers of acryl type (monopolymers or copolymers of acrylic acids and methacrylic acids or esters thereof or, more specifically, acrylic acid ester copolymers, methacrylic acid ester copolymers, and acrylic acid ester-methacrylic acid ester copolymers), polyvinyl butyral type, polyvinyl alcohol type, acryl-styrene type, polypropylene carbonate type, and cellulose type.

Although there is no particular limitation on the conductor paste for forming the metalized wiring layer, for example, one kind or two or more kinds of metal powders among Au, Cu, Ag, Pd, W, and Pt may be used. When two or more kinds of powders are used, they may be provided in the form of any of a mixture, an alloy, and a plurality of coating layers which are formed separately. Such metal powders are preferably used by mixing them with a binder constituted by an acrylic resin, an organic solvent such as a toluene, isopropyl alcohol, acetone, or terpineol, and a plasticizer. Preferably, the binder is mixed in a ratio of 0.5 to 15.0 parts by weight to 100 parts by weight of the metal powder, and the organic solvent is mixed in a ratio of 5 to 100 parts by weight to 100 parts by weight of solid components and the binder. Some inorganic components such as a glass powder and an oxide powder may be added to the conductor paste. The conductor paste is printed in a predetermined pattern on the green sheet using a well-known printing technique such as a screen printing process or gravure printing process.

Referring to manufacture of a ceramic multi-layer wiring substrate constituted by a plurality of ceramic layers stacked one on top of another and having an internal wiring, a ceramic filling layer including the same ceramic component as that in the ceramic layers is formed using a screen printing process in a region having no internal wiring formed therein between the ceramic layers which are stacked so that the internal wiring is sandwiched therebetween, and the printed surface is then dried in a hot-air drying oven or a far infrared drying oven. The resultant ceramic green sheet is subjected to a pressure leveling step under a temperature condition in the range of 50° C. to 80° C. to level the ceramic filling layer through plastic deformation. Thus, a ceramic green sheet having substantially no irregularity is obtained.

An appropriate bond including a binder, a solvent, and a plasticizer is applied or transferred to the green sheet, and this green sheet is then integrated with another green sheet by stacking and pressing to fabricate a stack of green sheets. The green sheet stack thus obtained is then fired under predetermined conditions to obtain a ceramic multi-layer wiring substrate.

In more detail, in the invention, as shown in the flowchart in FIG. 1, at step s1, a ceramic paste is formed by printing a ceramic paste on a part of the ceramic green sheet to be the ceramic layer having the internal wiring formed thereon using a screen printing process, a conductor paste layer to be internal wiring not existing in the part of the ceramic green sheet, the ceramic paste including the ceramic component, an acrylic resin, and a cellulose resin, and loss factor tan δ of the ceramic paste represented by (loss modulus)/(storage modulus) in a dry condition after printing being equal to or greater than loss factor tan δ of the conductor paste layer in a dry condition. Next, at step s2, the ceramic paste layer is dried and thereafter pressed at a temperature equal to or higher than a glass-transition temperature of the acrylic resin to level the ceramic paste layer with a surface of the ceramic green sheet through plastic deformation. Next, at step s3, the ceramic green sheet having the ceramic paste layer formed thereon and another ceramic green sheet are stacked to fabricate a stack of ceramic green sheets. Next, at step s4, the stack of ceramic green sheets is fired. Thus, the ceramic multi-layer wiring substrate is obtained.

A detailed description will now be made on a method of manufacturing a ceramic paste used in a ceramic multi-layer wiring substrate according to the invention, the description also addressing a ceramic multi-layer wiring substrate utilizing the ceramic paste.

The ceramic material included in the ceramic paste is essentially the same ceramic as that for the ceramic multi-layer wiring substrate. The ceramic powder may be a mixed oxide obtained by mixing $SiO_2$, $Al_2O_3$, $ZrO_2$, or $TiO_2$ with an alkaline earth metal oxide or a mixed oxide (e.g., spinel, mullite, or cordiarite) including at least one kind of compound selected from ZnO, MgO, $MgAl_2O_4$, $ZnAl_2O_4$, $MgSiO_3$, $Mg_2SiO_4$, $Zn_2SiO_4$, $Zn_2TiO_4$, $SrTiO_3$, $CaTiO_3$, $MgTiO_3$, $BaTiO_3$, $CaMgSi_2O_6$, $SrAl_2Si_2O_8$, $BaAl_2Si_2O_8$, $CaAl_2Si_2O_8$, $Mg_2Al_4Si_5O_{18}$, $Zn_2Al_4Si_5O_{18}$, AlN, $Si_3N_4$, SiC, $Al_2O_3$, and $SiO_2$, and such a mixed oxide may be selected according to the purpose of use.

For example, the glass powder is preferably a glass including at least one kind of compound selected from a group of compounds of $SiO_2$—$B_2O_3$ type, $SiO_2$—$B_2O_3$—$Al_2O_3$ type, $SiO_2$—$B_2O_3$—$Al_2O_3$-MO type (M is Ca, Sr, Mg, Ba, or Zn), $SiO_2$—$Al_2O_3$-$M_1$O-$M_2$O type ($M_1$ and $M_2$ are the same element or different elements among Ca, Sr, Mg, Ba, or Zn), $SiO_2$—$B_2O_3$—$Al_2O_3$-$M_1$O-$M_2$O type ($M_1$ and $M_2$ may be the same elements as above), $SiO_2$—$B_2O_3$-$M_3$O type ($M_3$ is Li, Na, or K), and $SiO2$—$B_2O_3$—$Al_2O_3$-$M_3$O type ($M_3$ may be the same elements as above), Pb type glass, Bi type glass, alkaline metal oxide, alkaline earth metal oxide, and rare-earth metal oxide. Those glasses to be used include glasses which remain amorphous even after being subjected to a firing process and glasses which are transformed by a firing process into crystallized glasses on which crystals of at least one kind among lithium silicate, quartz, cristobalite, cordierite, mullite, anorthite, celsian, spinel, gahnite, willemite, dolomite, petalite, and substitution derivatives thereof are deposited.

The ceramic power-glass power mixing ratio is that used in normal glass ceramic substrate materials and is preferably in the range of 60:40 to 1:99 by weight.

$B_2O_3$, ZnO, $MnO_2$, an alkaline metal oxide, an alkaline earth metal oxide, or a rare-earth metal oxide may be used as the assistant component, and they may be selected according to the purpose of use.

The binder for the ceramic paste according to the invention includes an acrylic resin and a cellulose resin as essential components. The paste is balanced with an internal wiring in terms of viscoelasticity by controlling the balance of mixing of those components and the glass-transition temperature and molecular weight of the acrylic resin.

When only an acrylic resin is used as the binder, it is difficult to improve the viscosity and thixotropy of the ceramic paste, and it is necessary to improve the viscosity and thixotropy of the paste by increasing the amount of the binder or decreasing the amount of the solvent. In this case, however, a problem arises during screen printing in that the paste will exhibit high spinnability and low separability from the press plate (screen press plate). Increasing the amount of the binder can result in air gaps in a sintered body obtained after firing because the sintered body will have a low density. When the amount of the solvent is decreased, a problem arises in that the fluidity of the ceramic paste is reduced.

On the other hand, when only a cellulose resin is used as the binder, the ceramic paste has a low fluidity so that it is difficult to level the paste sufficiently at a pressure leveling step. Further, the use of only a cellulose resin will result in a low loss factor tan δ in a dry condition or in a tendency in which elastic behaviors are more dominant than viscous behaviors. It is therefore difficult to control the loss factor tan δ of the paste in a dry condition so as to be higher than that of the internal wiring.

From those points of view, according to the invention, the above-described problems can be solved by preparing a ceramic paste which includes an acrylic resin and a cellulose resin as essential components and controlling the composition of the components and properties of the acrylic resin.

The acrylic resin may be monopolymers or copolymers of acrylic acids, methacrylic acids or esters thereof and, more specifically, acrylic acid ester copolymers, methacrylic acid ester copolymers, and acrylic acid ester-methacrylic acid ester copolymers. A hydroxyl group, carboxyl group, alkylene oxide group, glycidyl group, amino group, or amide group may be introduced to those copolymers as occasion demands. The introduction of those groups is expected to have the effect of improving dispersion of the ceramic and the effect of improving viscosity and thixotropy. Further, styrene, α-methyl styrene, acrylonitrile, ethylene, vinyl acetate, polyvinyl alcohol, or n-vinyl-pyrrodidone which can be copolymerized with an acrylic resin may be introduced as occasion demands, provided that characteristics such as heat decomposability and solubility to various solvents will not be degraded. One kind or two or more kinds among those acrylic resins may be selectively used as occasion demands.

The glass transition temperature of an acrylic resin in the ceramic paste according to the invention must be adjusted to the range of 20° C. to 50° C., preferably to the range of 20° C. to 30° C. The ceramic paste including an acrylic resin and having a high loss factor tan δ in a dry condition relative to an internal wiring is screen-printed and is thereafter pressed under a heating condition equal to or higher than the glass transition temperature of the acrylic resin including a printed material which has been dried in a hot-air drying oven or far infrared drying oven. Thus, it is possible to provide the ceramic paste layer with fluidity during the pressure leveling step and to achieve high flatness of the layer without increasing the amounts of the plasticizer and solvent.

When the glass-transition temperature of the acrylic resin is lower than 20° C., the printed material sometimes remains viscous even if the screen printing is followed by the drying step. As a result, the printed material tends to be subjected to cohesive breakage or interfacial breakage and consequently transferred to (or deposited on) a surface of the press during the subsequent pressure leveling step that is performed while applying heat.

In order to prevent the printed material from being transferred to (or deposited on) the press surface at the pressure leveling step that is accompanied by heating, it is desirable to perform a process for improving the releasability of the press surface such as a fluorine process or silicone process or to provide means for interposing a resin sheet such as PET which has been processed for improved releasability using silicone or wax between the printed material and the press surface.

When the glass-transition temperature of the acrylic resin is over 50° C., the printed material tends to have low fluidity if the pressure leveling step is performed in a temperature range of 80° C. or lower at which the ceramic multi-layer wiring substrate as a whole will not be deformed.

The following facts were found from the above-described points of view. High screen-printability can be achieved by setting the glass-transition temperature of the acrylic resin used in the ceramic paste in the range of 20° C. to 50° C. and using a cellulose resin in combination with the acrylic resin. At the subsequent pressure leveling step following the drying step, when the loss factor tan δ of the ceramic paste in a dry condition and in a temperature range in which no deformation occurs in the ceramic multi-layer wiring substrate as a whole is made equal to or higher than the loss factor tan δ of the adjacent internal wiring under the same condition, the ceramic paste layer whose behavior is dominantly viscous is selectively deformed and leveled, and no significant stress is applied to the adjacent internal wiring. Therefore, deformation and damage of the internal wiring can be prevented.

Specifically, let us assume that the loss factor tan δ of the ceramic paste in a dry condition at, for example, 60° C. is controlled so as to be equal to or greater than the loss factor tan δ of the adjacent internal wiring under the same condition. Then, by setting the temperature condition of the subsequent pressure leveling step in the range of 50° C. to 80° C., the ceramic paste after printing can be provided with sufficient fluidity without increasing the amount of the plasticizer and solvent, and deformation and damage of the internal wiring can be prevented.

When the temperature condition of the pressure leveling step is set to be lower than 50° C., the ceramic layer may be insufficiently leveled. It is also undesirable to perform the step at a temperature over 80° C. because the ceramic layer will tends to be deformed.

The molecular weight of the acrylic resin used in the ceramic paste must be adjusted so as to reside in the range of 40000 to 60000, and the spinnability of the ceramic paste can be reduced by limiting the molecular weight in this range. When the molecular weight is less than 40000, it is difficult to provide the ceramic paste with higher viscosity. There will be a tendency toward lower screen-printability and insufficient strength of the printed filler. On the other hand, when the molecular weight exceeds 60000, there will be a tendency toward more significant spinnability of the ceramic paste and lower screen-printability, e.g., lower separability from the press plate during printing.

At least either of nitrocellulose (soluble cotton) and ethyl cellulose which are suitable for screen printing may be used as the cellulose resin.

The acrylic resin and cellulose resin may be used by mixing them in any ratio as long as they are dissolved in the solvent and are mutually soluble. Preferably, the acrylic resin constitutes 20% to 90% by weight to the total amount or 100% by weight of the mixture of the acrylic resin and the cellulose resin. More preferably, the acrylic resin constitutes 50% to 90% by weight. When the acrylic resin is less than 20% by weight, it is difficult to keep the loss factor tan δ of the ceramic paste higher than that of the internal wiring or, in other words, to make viscous behaviors more dominant than elastic behaviors to provide the ceramic paste with sufficient fluidity without deforming the internal wiring at the pressure leveling step performed while applying heat. When the acrylic resin exceeds 90% by weight, the ceramic paste tends to exhibit somewhat insufficient thixotropy during screen printing.

The solvent used in the ceramic paste according to the invention may be selected from among a group of high boiling point solvents commonly used for screen printing. Specifically, a solvent having a boiling point of 150° C. or higher is preferable, and a solvent having a boiling point in the range of 200° C. to 250° C. is more preferable. A solvent having a boiling point lower than 150° C. is likely to cause problems such as clogging of the mesh of the screen as a result of volatilization of the same during screen printing. In the case of a solvent having a boiling point of 250° C., it is difficult to dry a printed material sufficiently, and the insufficiently dried printed material tends to be transferred onto the press surface at the pressure leveling step performed while applying heat.

Further, it is preferable to select a solvent which dissolves both of the acrylic resin and the cellulose resin serving as binders according to the invention. One example of a solvent satisfying those conditions is a mixed solvent of terpineol and butyl carbitol acetate.

In common pastes used for screen printing, resin content serving as a binder is used in 1 part to 30 parts by weight relative to 100 parts by weight of various ceramic powders. However, the invention is not limited to such a range because the optimum mixing ratio varies depending on the specific gravity of the ceramic powder used.

The ceramic paste according to the invention comprises any of various ceramic powders, a binder including an acrylic resin and a cellulose resin, a solvent, a plasticizer, a slip additive, and a disperser. Further, various thixotropic agents and thickening agents may be added as occasions demand.

Although there is no particular limitation on the plasticizer, preferable plasticizers include, for example, phthalate esters such as dimethyl phthalate, dibutyl phthalate, di-2-ethylhexylphthalate, diheptyl phthalate, di-n-octylphthalate, diisononyl phthalate, diisodecyl phthalate, butyl benzinl phthalate, ethyl phthalyl ethyl glycolate, and butyl phtalyl butyl glycolate; aliphatic esters such as di-2-ethylhexyladipate and dibutyl diglycol agipate; and trimellitic acids such as trimellitic acid and tri-2-ethylhexyl. The plasticizer includes at least one kind of compound selected from among them. In particular, phthalate plasticizers such as dibutyl phthalate (DBP) and di-2-ethylhexylphthalate (DOP) are preferable.

Although there is no particular limitation on the slip additive, preferable slip additives include, for example, ethylene glycol types such as diethylene glycol, triethylene glycol, polyethylene glycol, diethylene glycol methyl ether, triethylene glycol methyl ether, diethylene glycol ethylene ether, diethylene glycol-n-butyl ether, triethylene glycol-n-butyl ether, ethylene glycol phenyl ether, ethylene glycol-n-acetate, diethylene glycol monohexyl ether, and diethylene glycol monovinyl ether; propylene glycol types such as dipropylene glycol, tripropylene glycol, polypropylene glycol, dipropylene glycol methyl ether, tripropylene glycol methyl ether, dipropylene glycol monoethyl ether, dipropylene glycol-n-butyl ether, tripropylene glycol-n-butyl ether, propylene glycol phenyl ether, ethylene glycol benzyl ether, and ethylene glycol isoamyl ether; glycerin types such as glycerin, diglycerin, and polyglycerin; natual wax types such as bees wax and haze wax; synthetic wax types such as paraffin wax, microcrystalline wax, and low-molecular-weight polyethylene including derivatives thereof; aliphatic acid types such as stearic acid and lauric acid; fatty amid types such as maleimide and stearic amide; and alphatic metal salt types such as aluminum stearate, magnesium stearate and calcium stearate. The slip additive includes at least one kind of compound selected. from among them. In particular, polyethylene glycol (PEG) and glycerin are preferable.

EXAMPLE

Examples of the method of manufacturing a ceramic paste and a ceramic multi-layer wiring substrate according to the invention will now be described.

[Measurement of Loss Factor tan δ]

A rheology measuring apparatus (Model MCR300 manufactured by Physica Messtechnik BmbH) was used for measurement of loss factor tan δ represented by (loss modulus)/(storage modulus) described in the present embodiment. A ceramic paste and a conductor paste to be an internal wiring were printed using a screen printing machine such that the ceramic paste and the conductor paste wound be in the form of sheets each having a thickness of 100 μm, and the ceramic paste and the conductor paste were dried for one hour at 80° C. using a hot-air drying oven. The dried sheet-like materials were set in a metal mold of a pressing machine and were pressed at a pressure of $4.9 \times 10^6$ Pa to fabricate samples for measurement in the form of disks having a thickness of 0.5 mm and a diameter of 20 mm.

A distortion was imparted to the measurement samples under a constant temperature condition of 60° C., the distortion being varied from 0% to 100% by sweeping it at a frequency of 100 Hz. A storage modulus and a loss modulus were measured on each sample. While an elastic body is distorted in the same phase when such a sinusoidal distortion is imparted to the same, a viscous body is distorted at a phase shift of 90°. A ceramic paste which is a viscoelastic body intervening those bodies in properties will have a phase shift in the range of 0° to 90° when a distortion is imparted. Taking advantage of the fact, loss factor tan δ=(loss modulus)/(storage modulus) was obtained. The loss factor tan δ of the conductor paste was 0.5 as a result of measurement when the conductor paste had the composition to be described later.

Examples 1 to 10

A binder, additives such as a plasticizer, and an organic solvent were added to a mixed powder of alumina type ceramics mainly composed of alumina to prepare slurry, and the slurry was molded using a doctor blade process and then dried to fabricate a green sheet of 50 mm horizontal×50 mm vertical×0.3 mm thick size.

Next, to 100 parts by weight of mixed powders of alumina type ceramics mainly composed by alumina, 5 parts by weight of a binder having percentages of composition as shown in Table 1 below, 20 parts by weight of a mixed solvent of terpineol and butyl carbitol acetate, and 20 parts by weight of a phthalate ester type plasticizer (a mixture of DOP and DBP) were added and agitated to be mixed. Thereafter, mixing was performed using a triple roll mill until aggregates of the ceramic powders and the binder were eliminated to prepare ceramic pastes.

To 100 parts by weight of a tungsten powder, 1.5 parts by weight of a binder composed of an acrylic resin and nitrocellulose in a ratio of 3:2, 5 parts by weight of a mixed solvent of terpineol and butyl carbitol acetate, and 5 parts by weight of a phthalate ester type plasticizer (a mixture of DOP and DBP) were added and agitated to be sufficiently mixed. The acrylic resin used had a glass-transition temperature of 50° C. and a molecular weight of 50000. Thereafter, mixing was performed using a triple roll mill until aggregates of the tungsten powder and the resin were eliminated to prepare a conductor paste to be a metalized wiring.

Further, the conductor paste was applied to a principal surface of the green sheet in a wiring pattern having a height (thickness) of 15 μm by using a screen printing process and was then dried for one hour at 80° C. using a hot-air drying oven to form a metalized wiring. A ceramic filling layer was formed by screen-printing each of the ceramic pastes in a region where the metalized wiring is not formed, and the layer was then dried for one hour at 80° C. using a hot-air drying oven to fabricate a green sheet.

Table 1 shows spinnability and releasability from the press plate which are characteristics of screen printing utilizing the various ceramic pastes, the releasability being indicated by circles (good), triangles (not bad), and crosses (poor). Values of loss factor tan δ measured in a dry condition by a rheology measuring apparatus are also shown in Table 1.

Subsequently, a pressure of $4.9 \times 10^6$ Pa was applied under the heating temperature conditions shown in Table 1 to a printing surface of each of the two ceramic green sheet thus obtained using a surface-leveling press machine with a PET (polyethylene terephthalate) film, which had been subjected to a releasability treatment using silicone, interposed between the two ceramic green sheets. The ceramic filling layer was thus leveled through plastic deformation. At this time, visual check was conducted to see whether the printed material was transferred onto the PET releasing surface as a result of cohesive breakage.

Subsequently, five green sheets were integrated by stacking and pressing the green sheets on which a bond including an acrylic resin, a solvent, and a phthalate ester type plasticizer is applied, to fabricate a stack of green sheets having an internal wiring.

Finally, the stack of green sheets was fired at a temperature around 1600° C. to obtain a ceramic multi-layer wiring substrate. The resultant ceramic multi-layer wiring substrate was measured using a high speed three-dimensional shape measuring system (Model EMS98AD-3D100XY manufactured by COMS K.K.). Maximum height differences are shown in Table 1 as maximum warp values. The presence of any layer bonding failure was observed at a certain magnification, and the results are shown in Table 1.

Comparative Examples 1 to 9

Ceramic multi-layer wiring boards were fabricated similarly to Examples 1 to 10 except that the components of the binders in the ceramic pastes and the heating temperature conditions in Examples 1 to 10 were changed to those shown in the columns of Comparative Examples 1 to 9 in Table 1.

TABLE 1

| | Composition rate of binder | Acrylic resin | | | | | | Transfer of printed | Maximum | |
|---|---|---|---|---|---|---|---|---|---|---|
| | Acrylic resin/ Nitrocellulose/ Ethyl cellulose | Glass-transition temperature (° C.) | Molecular weight | Heating temperature (° C.) | tan δ | Screen printing characteristics | | material onto PET surface | warp value (μm) | Layer bonding failure |
| | | | | | | Spinnability | Releasability | | | |
| Example 1 | 7/2/1 | 20 | 50000 | 60 | 1.3 | No | ○ | No | 6.5 | No |
| Example 2 | 7/2/1 | 30 | 50000 | 60 | 1.3 | No | ○ | No | 5.2 | No |
| Example 3 | 7/2/1 | 40 | 50000 | 60 | 1.1 | No | ○ | No | 6.2 | No |
| Example 4 | 7/2/1 | 50 | 50000 | 60 | 0.8 | No | ○ | No | 5.6 | No |
| Example 5 | 7/2/1 | 30 | 40000 | 60 | 1.2 | No | ○ | No | 3.8 | No |
| Example 6 | 7/2/1 | 30 | 60000 | 60 | 1.1 | No | ○ | No | 7.1 | No |
| Example 7 | 7/2/1 | 30 | 50000 | 50 | 1.2 | No | ○ | No | 6.8 | No |
| Example 8 | 7/2/1 | 30 | 50000 | 80 | 1.3 | No | ○ | No | 4.3 | No |
| Example 9 | 7/1/0 | 30 | 50000 | 60 | 1.4 | No | ○ | No | 6.6 | No |
| Example 10 | 7/0/1 | 30 | 50000 | 60 | 1.3 | No | ○ | No | 7.3 | No |
| Comparative Example 1 | 7/2/1 | 10 | 50000 | 60 | 1.5 | Present | Δ | Present | 5.5 | No |
| Comparative Example 2 | 7/2/1 | 60 | 50000 | 60 | 0.4 | No | ○ | No | 11.2 | Present |
| Comparative Example 3 | 7/2/1 | 30 | 50000 | 40 | 1.1 | No | ○ | No | 13.4 | Present |
| Comparative Example 4 | 7/2/1 | 30 | 50000 | 90 | 1.2 | No | ○ | Present | 12.6 | No |
| Comparative Example 5 | 1/0/0 | 30 | 50000 | 60 | 1.5 | Present | X | Present | 6.2 | No |
| Comparative Example 6 | 0/1/0 | — | — | 60 | 0.2 | No | ○ | No | 14.5 | Present |
| Comparative Example 7 | 0/0/1 | — | — | 60 | 0.2 | No | ○ | No | 16.4 | Present |
| Comparative Example 8 | 7/2/1 | 30 | 30000 | 60 | 1.6 | No | ○ | Present | 7.2 | No |
| Comparative Example 9 | 7/2/1 | 30 | 70000 | 60 | 1.0 | Present | X | No | 5.5 | No |

As shown in Table 1, the ceramic multi-layer wiring substrates manufactured according to the invention using the ceramic pastes of Examples 1 to 10 were preferable in spinnablity and releasability from the press plate which are characteristics indicating screen-printability. Further, each printed material had a loss factor tan δ in a dry condition higher than the loss factor tan δ=0.5 of the internal wiring, and high flatness could therefore be achieved without deforming and damaging the internal wiring. As a result, it was possible to prevent the occurrence of layer bonding failures and warping deformation in the fired products effectively.

Further, since the leveling was performed under a heating temperature condition in the range of 50° C. to 80° C., warping and layer bonding failures could be prevented.

Furthermore, it was possible to prevent failures such as transfer of the printed materials onto the releasing surface of the PET film as a result of cohesive breakage.

On the contrary, in Comparative Example 1, since the glass-transition temperature of the acrylic resin used in the ceramic filling layer was as low as 10° C., the layer exhibited high viscosity which resulted in significant spinnability during screen printing and exhibited slight reduction in releasability from the press plate. Further, since the printed material remained viscous even after being dried, there was such a defect that a part of the printed material was transferred onto the surface of the PET film which had been subjected to a releasability treatment using silicone at the time of the pressure leveling step.

In Comparative Example 2, since the glass-transition temperature of the acrylic resin used in the ceramic filling layer was as high as 60° C., the layer had low fluidity because the loss factor tan δ thereof in a dry condition was lower than that of the internal wiring in a temperature range in which the ceramic multi-layer wiring substrate as a whole was not deformed when pressed. Therefore, leveling could not be performed completely, which resulted in a great warp of the product and in some layer bonding failures.

In Comparative Example 3, since the heating temperature at the pressure leveling step was as low as 40° C., leveling could not be performed completely, which resulted in a great warp of the product and in some layer bonding failures.

In Comparative Example 4, since the heating temperature at the pressure leveling step was as high as 90° C., the strength of the printed material was reduced because of softening of the same during pressing. This resulted in such a defect that part of the printed material was transferred onto the PET film surface treated with silicone for improved releasability. Further, since the ceramic multi-layer substrate as a whole was deformed by the pressure, the product had a significant warp.

In Comparative Example 5, since only an acrylic resin was used in the ceramic filling layer, screen-printability was low because the printed paste had low viscosity and thixotropy. Further, since the printed material had low film strength, there was such a defect that part of the printed material was transferred onto the PET film surface treated with silicone for improved releasability, at the time of the pressure leveling step.

In Comparative Examples 6 and 7, since only nitrocellulose or ethyl cellulose was used in the ceramic filling layer, the printed material in a dry condition had a small loss factor tan δ and behaved in an elastic manner dominantly, and it was therefore difficult to perform leveling completely. In addition, since the loss factor tan δ is low relative to that of the internal wiring, the internal wiring was stressed and deformed at the pressure leveling step, which resulted in a great warp of the product and in some layer bonding failures.

In Comparative Example 8, since the molecular weight of the acrylic resin used in the ceramic filling layer was as small as 30000, the printed paste had low viscosity. Further, since the printed material had low film strength, there was such a defect that part of the printed material was transferred onto the PET film surface treated with silicone for improved releasability, at the time of the pressure leveling step.

In Comparative Example 9, since the molecular weight of the acrylic resin used in the ceramic filling layer was as large as 70000, spinnability was significant and releasability from the press plate was low during screen printing.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A ceramic paste used for manufacture of a ceramic multi-layer wiring substrate which is formed by stacking a plurality of ceramic layers one on top of another and which includes an internal wiring, the ceramic paste being printed, using a screen printing process, on a part of a ceramic green sheet to be a ceramic layer having the internal wiring formed thereon which part does not include the internal wiring, to form between the ceramic layers a ceramic filling layer containing a same ceramic component as that in the ceramic layers which ceramic filling layer is not formed on the internal wiring, the ceramic paste comprising:
a ceramic component;
an acrylic resin; and
a cellulose resin,
wherein loss factor tan δ represented by (loss modulus)/(storage modulus) of the ceramic paste in a dry condition after printing is equal to or greater than loss factor tan δ of a conductor paste layer to be the internal wiring in a dry condition,
wherein the acrylic resin constitutes 20% to 90% by weight to the total amount or 100% by weight of the mixture of the acrylic resin and the cellulose resin,
wherein the acrylic resin has a glass-transition temperature in a range of 20° C. to 50° C., and
wherein the cellulose resin is nitrocellulose.

2. The ceramic paste of claim 1, wherein the acrylic resin has a glass-transition temperature in a range of 20° C. to 30° C.

3. The ceramic paste of claim 1, wherein the acrylic resin has a molecular weight in a range of 40000 to 60000.

4. The ceramic paste of claim 2, wherein the acrylic resin has a molecular weight in a range of 40000 to 60000.

5. The ceramic paste of claim 1, wherein the acrylic resin constitutes 50% to 90% by weight to the total amount or 100% by weight of the mixture of the acrylic resin and the cellulose resin.

* * * * *

UNITED STATES PATENT AND TRADEMARK OFFICE
CERTIFICATE OF CORRECTION

PATENT NO. : 7,507,682 B2  Page 1 of 1
APPLICATION NO. : 11/064784
DATED : March 24, 2009
INVENTOR(S) : Hiroyuki Takase It is certified that error appears in the above-identified patent and that said Letters Patent is hereby corrected as shown below:

Title Page;
At reference (75), please delete inventors "Shinichi Suzuki," and "Yutaka Iki"

Signed and Sealed this

Twenty-third Day of June, 2009

JOHN DOLL
*Acting Director of the United States Patent and Trademark Office*